(12) United States Patent
Niederberger et al.

(10) Patent No.: US 9,519,012 B2
(45) Date of Patent: Dec. 13, 2016

(54) DETECTION CIRCUIT AND METHOD FOR OPERATING A DETECTION CIRCUIT

(75) Inventors: Mark Niederberger, Einsiedeln (CH); Vincenzo Leonardo, Wadenswil (CH)

(73) Assignee: AMS AG, Unterpremstaetten (AT)

( * ) Notice: Subject to any disclaimer, the term of this patent is extended or adjusted under 35 U.S.C. 154(b) by 599 days.

(21) Appl. No.: 13/637,360

(22) PCT Filed: Mar. 3, 2011

(86) PCT No.: PCT/EP2011/053197
§ 371 (c)(1),
(2), (4) Date: Dec. 10, 2012

(87) PCT Pub. No.: WO2011/120756
PCT Pub. Date: Oct. 6, 2011

(65) Prior Publication Data
US 2013/0076369 A1  Mar. 28, 2013

(30) Foreign Application Priority Data

Mar. 30, 2010  (DE) .......................... 10 2010 013 322

(51) Int. Cl.
*G01R 1/30* (2006.01)
*H03K 17/082* (2006.01)

(52) U.S. Cl.
CPC .............. *G01R 1/30* (2013.01); *H03K 17/0822* (2013.01); *H03K 2217/0027* (2013.01)

(58) Field of Classification Search
CPC .............. G01R 31/42; G01R 1/36; G01R 1/30; H03K 17/0822; H03K 2217/0027
USPC ............................................ 324/500–750.01
See application file for complete search history.

(56) References Cited

U.S. PATENT DOCUMENTS

| | | | |
|---|---|---|---|
| 5,898,554 A | 4/1999 | Schnetzka et al. | |
| 6,377,035 B1* | 4/2002 | Jurisch | 324/76.19 |
| 7,079,368 B2* | 7/2006 | Ishikawa | H03K 17/0822 |
| | | | 361/93.1 |
| 7,542,866 B1* | 6/2009 | Lovegren | G01F 23/284 |
| | | | 340/618 |
| 2002/0005721 A1* | 1/2002 | Lorito | 324/424 |
| 2005/0029990 A1* | 2/2005 | Tsukamoto | H01M 10/44 |
| | | | 320/135 |

(Continued)

FOREIGN PATENT DOCUMENTS

EP       1601104 A1    11/2005
JP    H 08-335862    12/1996

*Primary Examiner* — Jermele M Hollington
*Assistant Examiner* — Dustin Dickinson
(74) *Attorney, Agent, or Firm* — McDermott Will & Emery LLP

(57) ABSTRACT

A detection circuit has a detection path and a control path. The detection path comprises a signal limiter (1) with a signal input (11), which is connected to a detection node (OUT), and a filter (2) which is coupled to a signal output (12) of the signal limiter (1). The detection path also comprises a short circuit detector (3) with a first and a second detector input (31, 32) and a detector output (33), wherein the first detector input (31) is coupled to the filter (2). The control path comprises a control circuit (4) for controlling a switch (5) which is coupled to the detector output (33) and to the filter (2) by means of a control input (41) and is connected to the switch (5) by means of a control output (42). The switch (5) is coupled to the detection node (OUT) and to a supply node (VSS, VHV).

11 Claims, 2 Drawing Sheets

(56) References Cited

U.S. PATENT DOCUMENTS

Figure 1:
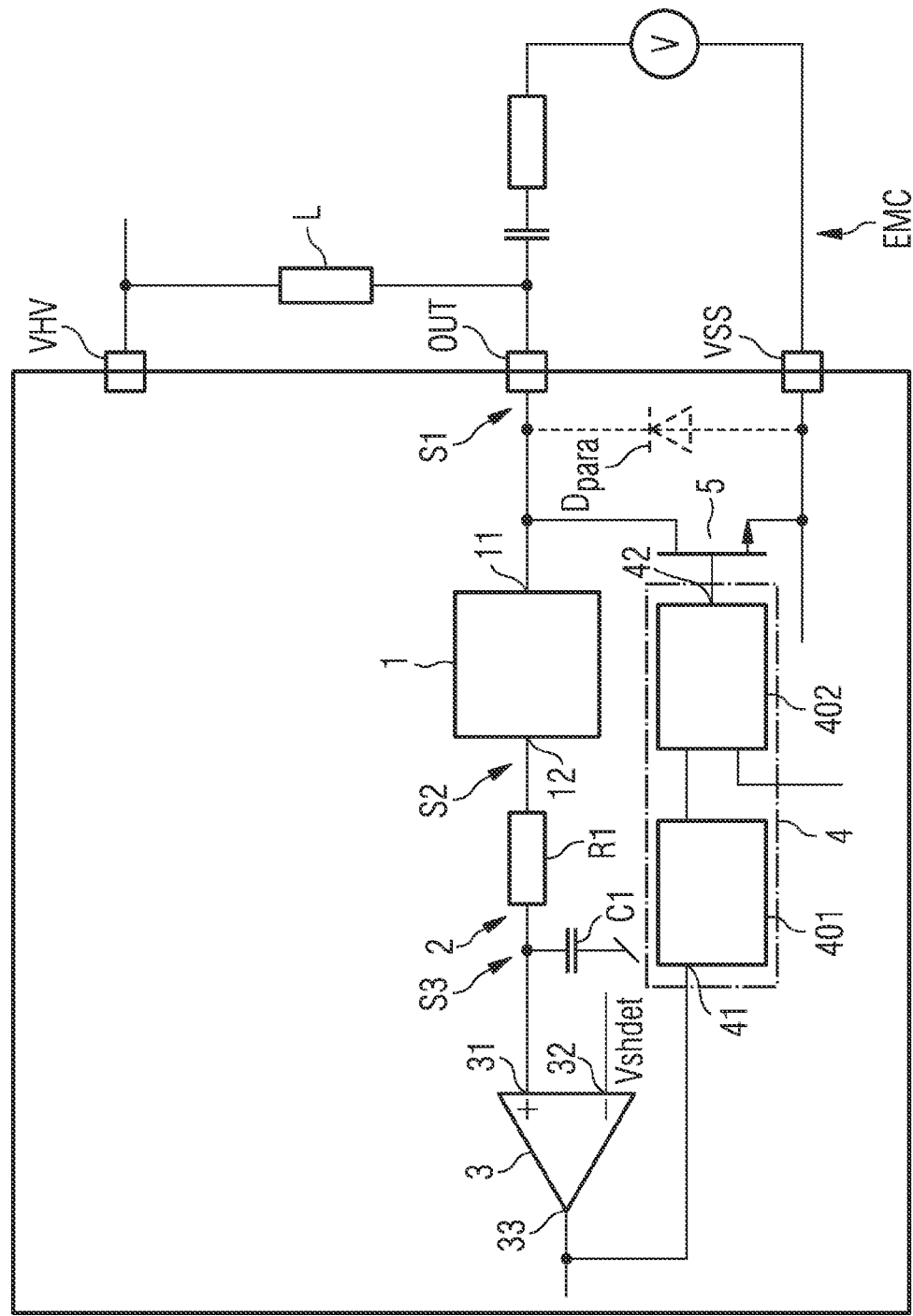

| | | | |
|---|---|---|---|
| 2006/0164769 A1* | 7/2006 | Stanford et al. | 361/87 |
| 2008/0074117 A1* | 3/2008 | Kamel et al. | 324/503 |
| 2008/0084229 A1* | 4/2008 | Frommer | G01R 31/34 324/765.01 |
| 2008/0094762 A1* | 4/2008 | Ochiai | H02P 29/032 361/24 |
| 2008/0212246 A1* | 9/2008 | Tanaka et al. | 361/86 |
| 2009/0144002 A1* | 6/2009 | Zettel et al. | 702/64 |

* cited by examiner

DETECTION CIRCUIT AND METHOD FOR OPERATING A DETECTION CIRCUIT

Switches are used in many industrial applications of sensors to switch an output terminal to a supply voltage or a reference potential. These low-side (NPN) or high-side (PNP) switches constitute power-electronic integrated circuits with additional protection and monitoring functions. A high-side switch switches a positive supply voltage and a low-side switch switches a negative supply voltage. A typical function of such switches is to signal a sensor state. Thus the switch is closed if a sensor detects something, and open if the sensor does not detect anything. The opposite case is also possible. On the output side, low-side and high-side switches are capable of driving roughly 100 mA and have an output resistance of less than 10Ω.

Another function of the switches includes the protection of a sensor from short circuits. If, for example, a short-circuit detection circuit detects a short circuit, a low-side or high-side switch causes a load to be switched off for a defined time interval (roughly 100 ms). After this shutdown time, there is another detection of a short circuit and another disconnection of the load for an additional interval of time. These shutdown times are generally programmable and can be 100 ms, 200 ms or some other suitable value.

It is of special importance that a short circuit can be determined with a high precision. This serves to protect the sensors. The short-circuit protection is also used to protect an entire system in which the sensor is installed. On the other hand, it must also be guaranteed that a sensor can function even if unfavorable but harmless ambient signals appear. Typical unfavorable ambient signals appear, for example, due to EMC conditions (EMC: Electromagnetic Compatibility) and express themselves in the form of pulses and signal peaks.

Typical detection circuits monitor a voltage at an output node, for example the drain terminal of a CMOS transistor (CMOS: Complementary Metal Oxide Semiconductor). A short circuit is indicated by the detection circuit if the voltage at the node is too high and thus exceeds a predetermined comparison value, for example. An appropriate switch such as the transistor will then open or close the switch and thus disconnect the load from a supply voltage, for example. It is disadvantageous that typical switches such as transistors have a parasitic diode effect. For instance, EMC signals or voltages thereby have a clearly symmetrical signal curve and have a negative or positive deflection. These signals may suffice to indicate a short circuit event even if there is none.

The problem of the invention is therefore to provide a detection circuit that can detect a short circuit with improved accuracy.

This problem is solved with the subject matter of the independent claims. Configurations and refinements are the subject matter of the dependent claims.

In one embodiment, the detection circuit comprises a detection path and a control path. The detection path comprises a signal limiter with a signal input that is connected to a detection node. The detection path further comprises a filter that is coupled to a signal output of the signal limiter. A short-circuit detector comprises a first and second detector input as well as a detector output. The first detector input is connected to the first filter.

The control path comprises a control circuit for controlling a switch. The control circuit is coupled to the detector output by means of the control input. A control output of the control circuit is connected to the switch. The switch is in turn coupled to the detection node and a supply node.

A sensor, for example can be connected to the detection node. If a short circuit appears at this sensor that could destroy the sensor, a signal characteristic of this event is present at the detection node. This signal is subsequently supplied initially to the signal limiter. The signal limiter is designed to limit the signal amplitude of the signal. In this manner, the signal limiter generates an intermediate signal that is supplied to the filter. The filter in turn filters the immediate signal into a filtered intermediate signal. The thus pre-processed filtered intermediate signal is then present at the short-circuit detector, for example the first detector input. The short-circuit detector is designed to recognize a short circuit event from the filtered intermediate signal and to accordingly generate a control signal that is supplied via the detector output to the control circuit or the control input.

The control circuit actuates the switch based on the control signal. If the short-circuit detector has detected a short circuit, then the control signal causes the switch to close or open and to separate a connected load from a supply voltage.

A signal at the detection node can advantageously be suitably limited by the signal limiter. For example, if signals that are undesired but are not harmful to the sensor are present at the detection node, this can be taken into account by the signal limiter. In this manner, rather large and time-limited deflections due to pulses and signal peaks do not lead to the detection of the short circuit. The signal amplitude can also be limited upward or downward, depending on the type of switch used, such as a low-side or high-side switch. Additionally, characteristic parameters for the detection circuit can be adjusted with the aid of the downstream filter. This guarantees, for example, that a sufficient limitation can be realized for signals typically appearing at the detection node. Due to the combination of the signal limiter and the downstream filter, it is therefore possible to realize an improved detection of short circuits.

The detection circuit is used for short-circuit protection. This prevents the circuit from being destroyed by thermal overload in case of a short circuit, for example. The detection circuit also offers protection for an entire system in which the sensor is installed together with the switch.

If the use of a switch with an asymmetric switching behavior is discussed directly or indirectly in the description below, this is not to be understood as a limitation, but only as one possible embodiment. If low-side or high-side switches are used, for example, they switch asymmetrically in that only positive or negative operating voltages are switched. Both cases can be implemented according to the invention without restriction. The switches (high-side or low-side) are typically components of the sensor. Whether the sensor has detected anything or not is signaled at appropriate outputs. Depending on the detection result and the specific implementation, the corresponding switch closes or opens.

The load of the switch can be a display lamp, a relay, an input of a PLC controller (PLC: programmable logic controller) or some other suitable electrical load.

In another embodiment, the signal limiter is designed to limit a signal at the detection node to an adjustable signal amplitude.

The detection circuit can favorably be adjusted to a defined field of use with the aid of the adjustable signal amplitude. For example, if the magnitudes of the characteristic signal amplitudes of interfering ambient signals are known or can be estimated, the circuit can be adjusted to them.

In another embodiment, the signal limiter is designed to limit a signal at the detection node to an adjustable measurement interval.

With an adjustable measurement interval, the detection accuracy of the detection circuit can advantageously be further improved. If interfering signals appear that have a notable deflection in both the positive and negative directions, this can be appropriately limited in both directions with the aid of the measurement interval.

In another embodiment, the signal limiter is designed to limit a signal symmetrically at the detection node. The signal limiter advantageously has emitter-followers or back-to-back diodes for this purpose.

An improved accuracy of the short-circuit detection can advantageously be achieved by the symmetric limitation. By restricting the signal limitation to a symmetrical measurement interval, the detection of a short circuit at the detection node becomes largely independent of the signal amplitudes at the detection node. Moreover, the filter can be optimally adjusted to this symmetrical measurement interval. A symmetrical measurement interval can be adjusted without restriction both for low-side and high-side switches.

In another embodiment, the filter is constructed as a low-pass filter.

The short-circuit detector in another embodiment is constructed as a comparator, and an adjustable threshold value can be supplied to the second detector input In particular, the adjustable threshold value on the detection circuit can be set in view of a concrete application. The threshold value is preferably selected in such a manner that it corresponds to the center of the symmetric measurement interval. The symmetric measurement interval can advantageously be adjusted by a user or at the factory. It is also conceivable, however, to adapt the measurement interval automatically during operation.

The use of the comparator as a short-circuit detector allows easy implementation in an integrated circuit. With the aid of the threshold value, it is also advantageously possible to adjust the detection circuit to its respective application. If the threshold value is also selected so that it corresponds to the center of the symmetric measurement interval, this allows a further improvement of the accuracy of the short-circuit detection. The threshold value is thus adjusted both to the signal limiter and the downstream filter.

In another embodiment, the control circuit comprises a debouncer that is connected to the control input and to the filter.

The debouncer is designed to control the switch in adjustable time intervals.

The debouncer makes it possible to repeat a detection measurement of a short circuit in defined adjustable time intervals. For example, if a signal having a short circuit is only present at the detection node for a short time, the switch can be operated again after the time interval. If a signal having a short circuit is present after expiration of this time interval, then the switch is actuated again. In this manner, the short-circuit detection can be iteratively repeated until the short circuit is no longer present. Unnecessarily long shutdown times of the sensor can advantageously be avoided in this way.

In another embodiment, the switch comprises a transistor whose load side connects the detection node and the supply node for a supply voltage, and whose control side is connected to the control output.

The detection circuit can advantageously be realized by using transistors in an integrated circuit. Both low-side and high-side switches can be used in this case.

In another embodiment, the switch comprises bipolar or unipolar transistors. Other switchable semiconductor elements such as SGBTs (Schottky gate bipolar transistors) are also conceivable.

In one embodiment, a method for operating a detection circuit comprises acquiring a signal at a detection node. A signal amplitude of the signal is limited and an intermediate signal obtained by limitation of the signal amplitudes is filtered. A short circuit is detected based on a comparison of the filtered intermediate signal to a previously determined comparison signal. A reference potential is applied based on the detection of the short circuit at the detection node An improved accuracy of the short-circuit detection can advantageously be achieved by limiting the signal amplitude. This prevents unfavorable but generally harmless ambient signals, such as those due to pulses or signal peaks, from indicating a short circuit when none is present. Such pulses or signal peaks can have relatively large signal amplitudes, so an improved accuracy of the short-circuit detection results from limiting these signal amplitudes.

A further improvement can be achieved by the additional filtering of the intermediate signal obtained by limiting the signal amplitude. Thus the filtering can be adjusted in such a manner that an intermediate signal that is below the predetermined comparison signal results for characteristically appearing signal amplitudes.

In another embodiment, the signal amplitude of the measurement parameter is limited to an adjustable measurement interval.

A further improvement of the short-circuit detection can be achieved with the aid of the adjustable measurement interval. The signal amplitudes can be limited to a characteristic range by a suitable selection of the measurement interval. A typically occurring range of signal amplitudes can be estimated or adjusted in this manner.

In another embodiment, the signal amplitude is limited symmetrically.

The precision of the short-circuit detection is even further improved by the symmetric limitation of the signal amplitude. In this manner, the detection is largely independent of the signal amplitude of the interfering signals at the detection node.

In another embodiment, the short circuit is detected repeatedly at adjustable time intervals.

An unnecessary shutdown time is avoided by an iterative repetition of the short-circuit detection in adjustable time intervals.

In another embodiment, the comparison signal is determined by the center of the measurement interval.

The measurement interval can be advantageously determined by selection or specification of the comparison signals, or vice versa. A precision adjustment of the method to occurring ambient signals becomes possible in this manner.

The invention will be described in detail below for example embodiments with reference to the figures. Components having the same function and effect are denoted by the same reference symbols. Insofar as components correspond to one another in function, a description of them will not be repeated in each of the following figures.

Therein:

FIG. 1 shows a detection circuit according to the proposed principle, and

Figure 2A:
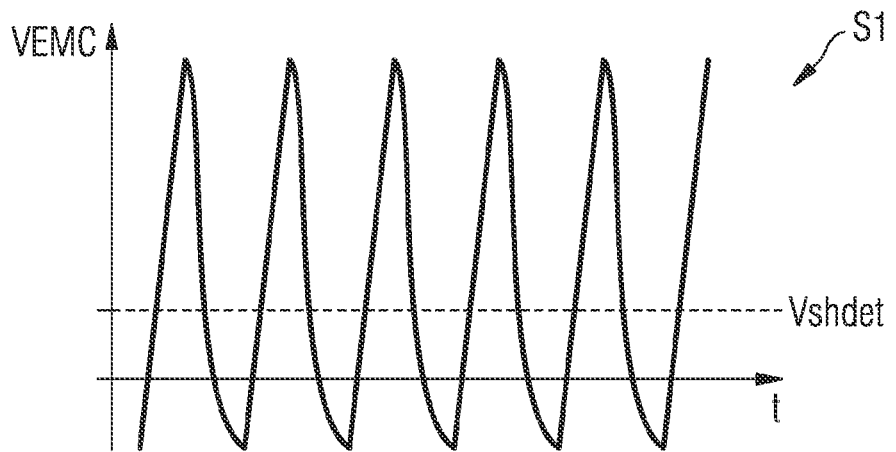
Figure 2B:
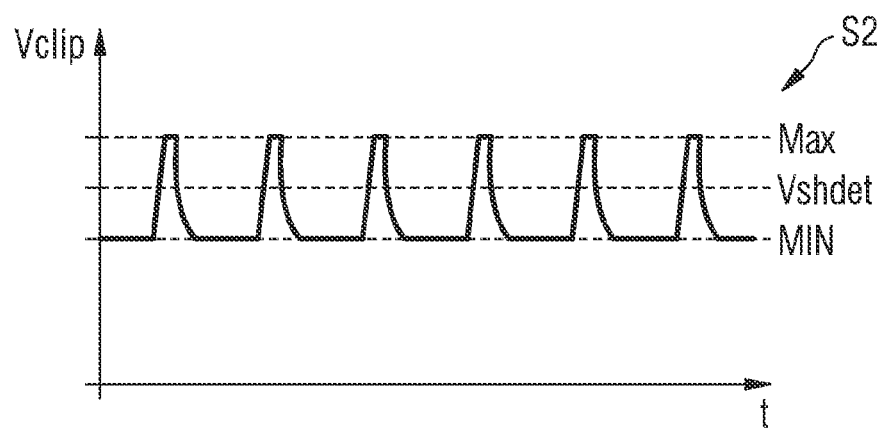
Figure 2C:
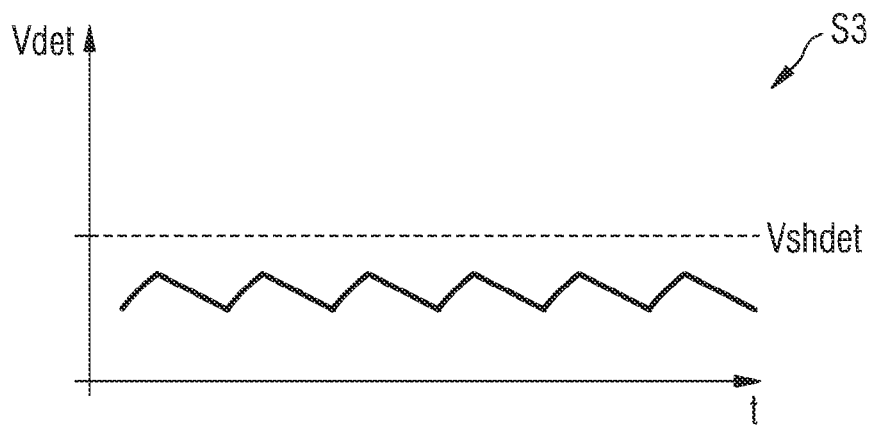

FIGS. 2A, 2B and 2C each show examples of signal curves in a detection circuit according to the proposed principle.

FIG. 1 shows a detection circuit based on the proposed principle. The detection circuit comprises a measurement path that comprises a detection node OUT, a signal limiter 1, a filter 2 and a short-circuit detector 3. In detail, the detection node OUT is connected to a signal input 11 of the signal limiter 1. A signal output 12 of the signal limiter 1 is connected to the filter 2. The filter 2 is constructed as an RC element and comprises a resistor R1 and a capacitor C1. The resistor R1 is connected both to the signal output 12 and to a first detector input 31 of the short-circuit detector 3. The short-circuit detector 3 further comprises a second detector input 32 at which an adjustable threshold value Vshdet is present.

A detector output 33 is connected to a control path via a control input 41. The control path comprises a control circuit 4 for controlling a switch 5 that comprises, on the one hand, the control input 41, and on the other, a debouncer 401 and a switching device 402. The debouncer 401 is present at the control input 41 and is coupled to the switching device 402. A control output 42 connects the switching device 402 to the switch 5. The switch 5 is in turn connected to the detection node OUT and a supply node VSS.

For the purpose of a simplified explanation, a load L is connected to the detection circuit via the detection node OUT and a voltage supply VHV. The connected load L represents a relay, a lamp or a switching input for a PLC controller, for example. An EMC generator is also connected via the detection node OUT and the supply voltage VSS to the detection circuit The detection circuit now detects signals present at the detection node and has means for detecting whether the signals indicate a short circuit or not. The signals present at the detection node comprise sensor signals (or short-circuit signals) and EMC signals generated by the EMC generator. In the ordinary application cases, the EMC generator is a parallel-wired cable or other electrical parameters in the immediate vicinity of the circuit.

Thus a signal VEMC is generally present at the detection node OUT. The characteristic signal curves that occur at different points S1, S2, S3 of the detection circuit will be described in detail with reference to FIGS. 2A, 2B and 2C.

The signal VEMC at the detection node OUT is first transferred to the signal limiter 1. The amplitude of the signal VEMC is symmetrically limited in this signal limiter 1. The limitation takes place within a measurement interval that is defined by a lower interval limit MIN and an upper interval limit MAX. An intermediate signal limited in this manner is transferred by the signal limiter 1 to a filter 2. The latter is preferably a low-pass filter consisting of the resistor R1 and the capacitor C1. An intermediate signal that is subsequently present at the first detection input 31 is generated in this manner. The short-circuit detector 3 is implemented as a comparator, for example, at the second input 32 of which the adjustable threshold value Vshdet is present. The threshold value Vshdet is preferably selected in such a manner that it corresponds to the center of the measurement interval MIN, MAX. This ensures that the filtered intermediate signal Vdet generally is below the threshold value Vshdet. Thus a short-circuit detection event is triggered for differing signal amplitudes of interference signals present at the detection node OUT.

If the short-circuit detector indicates a short circuit, it generates a control signal that is transferred to the control path via the control input 41. The control circuit 4 controls the switch 5. For this purpose, time intervals t can be set at the optional debouncer 401. The control signal causes the switch device 402 to actuate the switch 5 (an NMOS transistor (NMOS: n-type metal-oxide semiconductor), for example) or other suitable transistors. In case of a short circuit, the switch 5 is opened (for example, the NMOS transistor is switched off).

The (optional) debouncer 401 has the function of opening the switch 5 if a short circuit detected by the detection circuit is indicated for a given time tb (for example tb=100 μs). As soon as a short circuit has been indicated for the entire time tb at the debouncer 401, it is signaled to the switching device 402. The latter in turn actuates the switch 5 for the adjustable time interval of 100 ms, for example. The adjustable time interval t can also be suitably programmed. In a certain sense, the debouncer 401 is thus an additional low-pass filter, but one that is realized digitally.

The measurement path advantageously allows an increased accuracy of the short-circuit detection. Because of the adjustable measurement interval MIN, MAX of the signal limiter 1, the short-circuit detection becomes independent in large ranges of the signal amplitude of the voltage VEMC at the detection node OUT. This voltage is strongly asymmetric due to a parasitic diode effect DPARA due to the switch 5.

Asymmetric signals at the detection node OUT can also be taken into consideration with high accuracy. The accuracy of a short-circuit detection is further improved by the low-pass filter 2 and the comparison to the threshold value Vshdet. The optional debouncer 401 also has the advantageous effect that the shutdown times of a connected load after detection of a short circuit can be kept short.

The switch 5 can be implemented as a low-side switch, as shown without restriction of the invention in FIG. 1, or alternatively as a high-side switch. The illustrated principles of the detection circuit can be correspondingly modified and applied to the respective type of switch. Depending on its type, the switch 5 can be accordingly driven by the supply voltage VHV or the supply voltage VSS.

FIGS. 2A, 2B and 2C show the signal curves at the points marked S1, S2 and S3 in FIG. 1. In each case, the signal VEMC, Vclip, Vdet is plotted versus the time t.

In detail, FIG. 2A shows the signal VEMC present at the detection node OUT. This point is marked S1 in FIG. 1. Due to a parasitic diode DPARA of the switch 5 for example, the signal VEMC has a very asymmetric curve. This can also be caused by the source of the signal VEMC itself, however. As is evident in FIG. 2A, the signal VEMC is higher on average than the threshold value Vshdet and would indicate a short circuit at the short-circuit detector 3 if no further measures were taken.

FIG. 2B shows the signal curve at point S2 in FIG. 1 and shows the limited intermediate signal Vclip, after the signal amplitude of the signal VEMC has been limited by the signal limiter 1. Due to the symmetrical measurement interval MIN, MAX, this signal amplitude of the limited intermediate signal Vclip is correspondingly limited and is in general at or below the threshold value Vshdet.

FIG. 2C shows the filtered intermediate signal Vdet plotted against the time T at the point S3 in FIG. 1. The filtering has the effect that, even with strongly different and asymmetric signal amplitudes, interference signals resulting from EMC conditions remain below the threshold value Vshdet. They can then be unambiguously distinguished from short-circuit detection signals. Such a short circuit signal would be higher than the threshold value Vshdet, for example, and would also hardly fluctuate over time as long as the short circuit exists.

REFERENCE SYMBOL LIST

1 Signal limiter
11 Signal input
12 Signal output
2 Filter
3 Short-circuit detector
31 First detector input
32 Second detector input
33 Detector output
4 Control circuit
41 Control input
42 Control output
401 Debouncer
402 Switching device
5 Switch
C1 Capacitor
DPARA Parasitic diode
EMC EMC generator
L Load
MIN Measurement interval limit
MAX Measurement interval limit
OUT Detection node
S1 Signal point
S2 Signal point
S3 Signal point
t Adjustable time interval
tb Time
Vclip Limited intermediate signal
Vdet Filtered intermediate signal
VEMC Signal at the detection node
VHV Supply voltage
Vshdet Threshold value
VSS Supply voltage

What is claimed is:

1. A detection circuit comprising:
   a detection path comprising:
      a signal limiter for limiting the amplitude of a signal to a measurement interval which is adjustable by a threshold value and which limits the signal between minimum and maximum values, resulting in a limited intermediate detection signal having components below and above the threshold value within the boundaries of the minimum and maximum values, the threshold value determining the center of the measurement interval, the signal limiter being connected to a detection node by a signal input,
      a filter which is coupled to a signal output of the signal limiter and which filters the limited intermediate detection signal, so that components of the filtered limited intermediate detection signal are below the threshold value, and
      a short-circuit detector with a first and a second detector input, and a detector output, wherein the detector output is coupled to the filter, wherein the short-circuit detector detects a short circuit when the filtered limited intermediate detection signal exceeds the threshold value and;
   a control path comprising:
      a control circuit for controlling a switch, which is coupled by means of a control input to the detector output and is connected by means of a control output to the switch, and
      the switch, which is coupled to the detection node and a supply node.

2. The detection circuit according to claim 1, wherein the signal limiter is designed to limit a signal at the detection node to an adjustable signal amplitude.

3. The detection circuit according to claim 1 or 2, wherein the signal limiter is designed to limit a signal at the detection node symmetrically.

4. The detection circuit according to claim 1 or 2, wherein the filter is constructed as a low-pass filter.

5. The detection circuit according to claim 1, wherein the short-circuit detector is constructed as a comparator, and the threshold value is supplied at the second detector input.

6. The detection circuit according to claim 1, wherein the control circuit comprises a debouncer that is connected to the control input and to the filter, and the debouncer is designed to control the switch in adjustable time intervals.

7. The detection circuit according to claim 1, wherein the switch comprises a transistor whose load side connects the detection node and the supply node for a supply voltage, and whose control side is connected to the control output.

8. The detection circuit according to claim 1, wherein the switch comprises a bipolar or unipolar transistor or other switchable semiconductor elements.

9. A method for operating a detection circuit, comprising:
   detecting a signal at a detection node;
   limiting the amplitude of the signal to a measurement interval which is adjustable by a threshold value and which limits the signal between minimum and maximum values, resulting in a limited intermediate detection signal having components below and above the threshold value within the boundaries of the minimum and maximum values, the threshold value determining the center of the measurement interval;
   filtering the limited intermediate detection signal, so that components of the filtered limited intermediate detection signal are below the threshold value;
   detecting a short circuit when the filtered limited intermediate detection signal exceeds the threshold value; and
   applying a reference potential at the detection node based on the detection of the short circuit.

10. A method according to claim 9, wherein the signal amplitude is symmetrically limited.

11. A method according to claim 9, wherein the short circuit is detected at repeated, adjustable time intervals.

* * * * *